United States Patent [19]

Kuno et al.

[11] Patent Number: 4,495,467

[45] Date of Patent: Jan. 22, 1985

[54] APPARATUS FOR SIMULTANEOUS MEASUREMENT OF MAGNETIC FIELD COMPONENTS IN MUTUALLY PERPENDICULAR DIRECTIONS

[75] Inventors: Akira Kuno, Oobu; Muneaki Matsumoto, Okazaki; Koji Numata, Toyokawa, all of Japan

[73] Assignee: Nippon Soken, Inc., Nishio, Japan

[21] Appl. No.: 286,198

[22] Filed: Jul. 23, 1981

[30] Foreign Application Priority Data

Jul. 30, 1980 [JP] Japan ............................... 55-104800

[51] Int. Cl.³ ............................................ G01R 33/02
[52] U.S. Cl. .................................... 324/244; 324/247; 33/361
[58] Field of Search ............... 324/244, 247, 248, 253, 324/254, 255, 258, 260, 329, 233; 33/355–378

[56] References Cited

U.S. PATENT DOCUMENTS

| | | | |
|---|---|---|---|
| 3,781,664 | 12/1973 | Rorden | 324/247 |
| 3,991,361 | 11/1976 | Mattern et al. | 324/225 X |
| 4,030,026 | 6/1977 | Payne | 324/329 |
| 4,179,741 | 12/1979 | Rossani | 33/356 |
| 4,277,751 | 7/1981 | Lawson et al. | 324/254 |
| 4,379,366 | 4/1983 | Kuno et al. | 33/361 |
| 4,399,615 | 8/1983 | Matsumoto et al. | 324/354 X |

OTHER PUBLICATIONS

A. G. Wellbrook, "Measurement of Maximum Remanence Field Hsr" IBM Technical Bulletin, vol. 6, No. 7, Dec. 1963, p. 89.

Primary Examiner—Gerard R. Strecker
Assistant Examiner—Warren S. Edmonds
Attorney, Agent, or Firm—Cushman, Darby & Cushman

[57] ABSTRACT

A magnetic field measuring apparatus including a magnetic sensor having an excitation winding and orthogonal first and second output windings for generating a first and a second output signal indicative of the orthogonal components of an external magnetic field, adjusting circuits for adjusting the amplitude and frequency of the sensor output signals, circuits responsive to common timing signals whereby the outputs of the adjusting circuit are subjected to sample-and-hold operation and A/D conversion and the resulting converted outputs are counted to generate count outputs, and a first and a second display unit for simultaneously displaying the count outputs.

5 Claims, 7 Drawing Figures

4,495,467

APPARATUS FOR SIMULTANEOUS MEASUREMENT OF MAGNETIC FIELD COMPONENTS IN MUTUALLY PERPENDICULAR DIRECTIONS

BACKGROUND OF THE INVENTION

The present invention relates to a magnetic field measuring apparatus in which the components of a magnetic field in the mutually perpendicular X and Y directions are simultaneously measured and displayed in accordance with the output signals of a magnetic sensor and which is thus well suited for measuring the distribution of an external magnetic field.

In the past, there has been no method capable of simultaneously measuring and displaying the components of a magnetic field in the mutually perpendicular X and Y directions and methods have been used in which a Hall element or the like is used as a sensor such that the sensor is first turned in the X direction to measure the X-direction component of a magnetic field and then the sensor is turned in the Y direction normal to the X direction to measure the Y-direction component of the magnetic field.

With these prior art methods, it is difficult to accurately position the sensor in the X direction and in the Y direction normal to the former and thus it is impossible to accurately measure the components of a magnetic field in the X and Y directions.

SUMMARY OF THE INVENTION

It is the object of the present invention to provide a magnetic field measuring apparatus so designed that the components of a magnetic field in the mutually perpendicular X and Y directions are simultaneously sensed by a magnetic sensor and the X- and Y-direction field components are measured in accordance with the output signals of the X- and Y-output windings of the magnetic sensor, thus simultaneously and accurately displaying the X- and Y-direction components.

DESCRIPTION OF THE PREFERRED EMBODIMENTS

Figure 1:
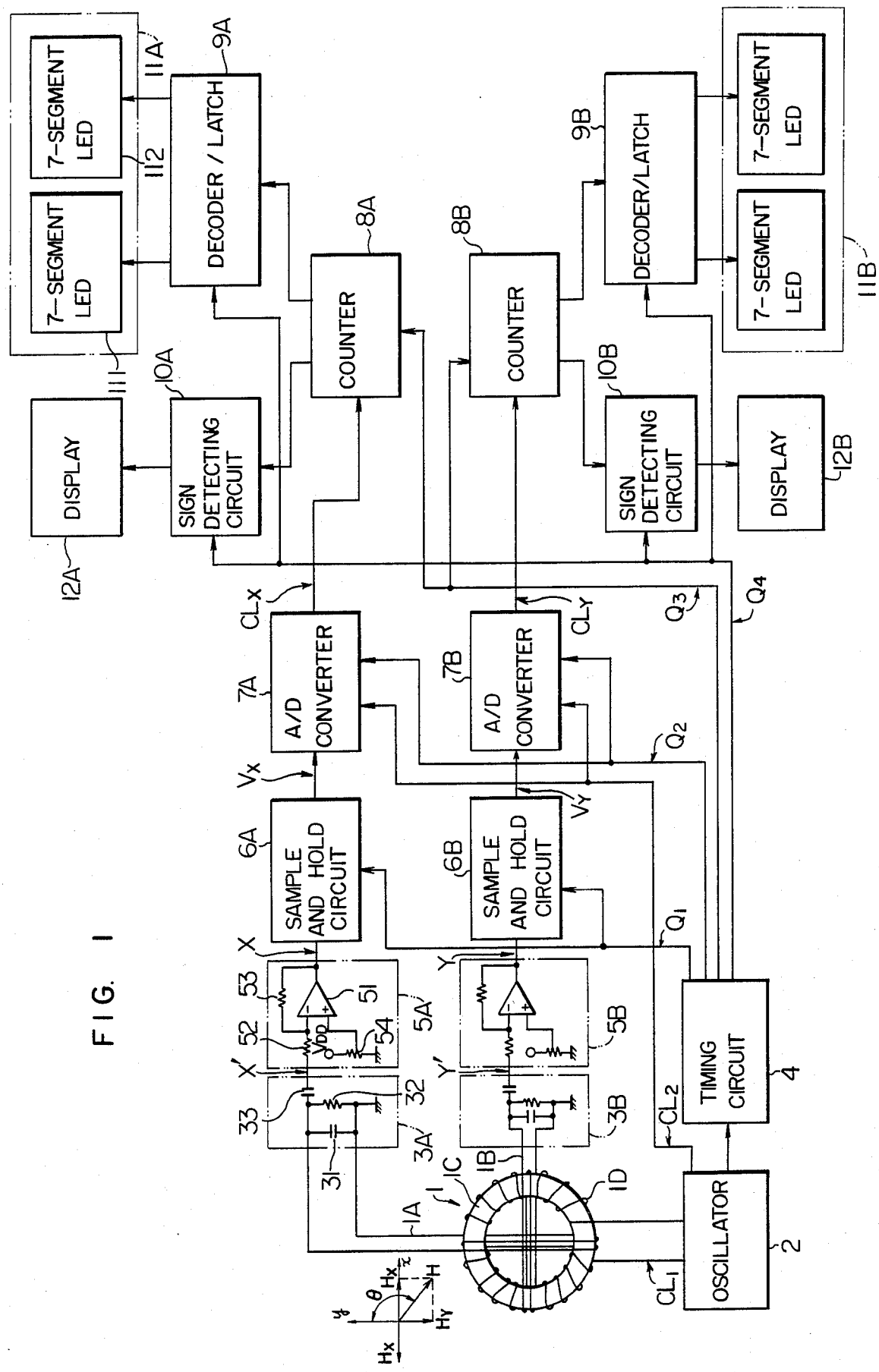
FIG. 1 is a block diagram showing the overall construction of a first embodiment of the present invention.
Figure 2:
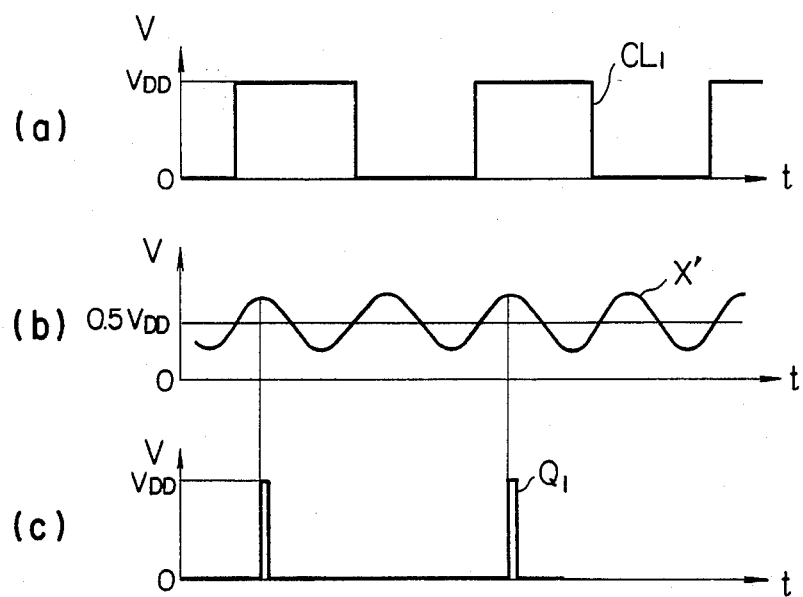
FIGS. 2 and 3 show various signal waveforms useful for explaining the operation of the invention.
Figure 3:
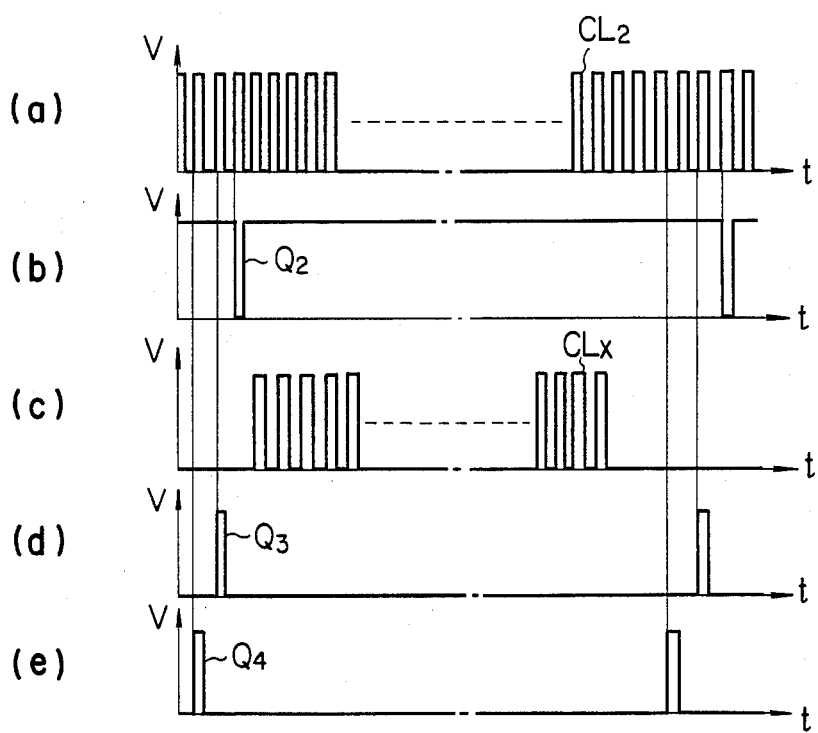
Figure 4:
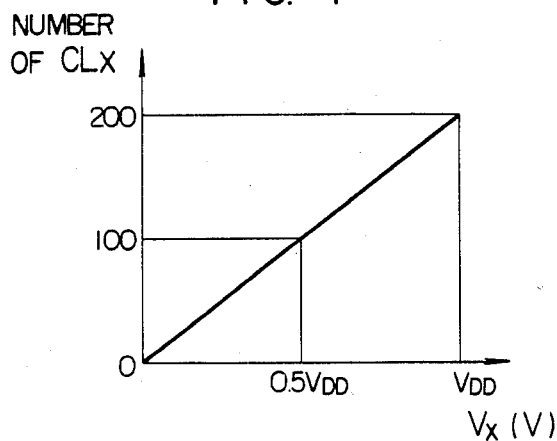
FIGS. 4, 5 and 6 are characteristic diagrams useful for explaining the operation of the invention.

In FIG. 1 showing the construction of a first embodiment of a magnetic field measuring apparatus according to the invention designed to display in 2-place digital form the components of a magnetic field in the X and Y directions, numeral 1 designates a magnetic sensor in which wound on a core 1C of ferromagnetic material are an excitation winding 1D and output windings 1A and 1B which are normal to each other. Numeral 2 designates an oscillator circuit for supplying the rectangular signal CL$_1$ shown in (a) of FIG. 2 to the excitation winding 1D for driving the magnetic sensor 1 at a frequency f. Assuming that H represents the intensity of a magnetic field applied to the magnetic sensor 1, HX the component of the magnetic field in the X direction normal to the output winding 1A and HY the component of the magnetic field in the Y direction normal to the output winding 1B, the output windings 1A and 1B generate outputs which are respectively proportional to HX and HY. Since the method of sensing and displaying the X direction component or HX of the magnetic field is the same with the method of sensing and displaying the HY, the method of sensing and displaying the X-direction component HX of the magnetic field will now be described. The output winding 1A generates an output proportional to the X-direction component HX of the magnetic field so that an LCR resonant circuit comprising a capacitor 31 and a resistor 32 of a filter 3A and the inductance of the output winding 1A generates an output X' of a frequency 2f component as shown in (b) of FIG. 2. A capacitor 33 of the filter 3A is provided to limit the DC component. The output X' is adjusted by an X-output adjusting circuit 5A to obtain a desired output X. The X-output adjusting circuit 5A forms an inverting amplifier circuit in which its amplification factor is set by the ratio between resistors 52 and 53 by means of an operational amplifier 51 (the RCA CA31-40AT) and the offset is adjusted by a resistor 54, thus providing the desired output X. The value of the output X is held by a sample and hold circuit 6A in synchronism with the timing signal Q$_1$ of a timing circuit 4 shown in (c) of FIG. 2 and an output VX is generated. Now, assuming a coordinate on the sensor 1 the Y axis of which is directed parallel to the output winding 1A and the X axis of which is directed parallel to the output winding 1B and assuming that an external magnetic field, e.g., earth magnetic field is applied, at an angle θ from the Y axis as shown in FIG. 1, to the sensor 1, then the components HX and HY are presented on the X and Y axes respectively, and the relationship between the output VX and the angle θ is given as follows.

$$VX = KX \cdot H\sin\theta + VDD/2$$
$$= KX \cdot HX + VDD/2$$

where KX is a proportionality constant and VDD is a power supply voltage. In the present embodiment, the power supply voltage VDD is selected 5 V and the rate of change of the output VX per unit input is selected 2.5 mV/1 m Gauss. In synchronism with the signal Q$_2$ from the timing circuit 4 shown in (b) of FIG. 3, an A/D converter circuit 7A performs the operation of A/D conversion on the output VX in response to the clock pulses CL$_2$ from the oscillator circuit 2 having a frequency of about 300 kHz and shown in (a) of FIG. 3 and the clock pulses CLS shown in (c) of FIG. 3 are generated in number proportional to the analog voltage VX. The relationship between the analog voltage VX and the number of clock pulses CLX becomes as shown in FIG. 4. From this relationship it results in 10 m Gauss per clock pulse CLX. A counter circuit 8A is of the type which generates a BCD code signal having the following relationship with the input clock pulses CLX.

(a) If $0 \leq VX \leq \frac{1}{2}VDD$ or $0 \leq CLX \leq 100$ pulses, then (100−CLX) is generated in BCD code form, which is an output signal used for the display of a negative sign mentioned later.

Figure 5:
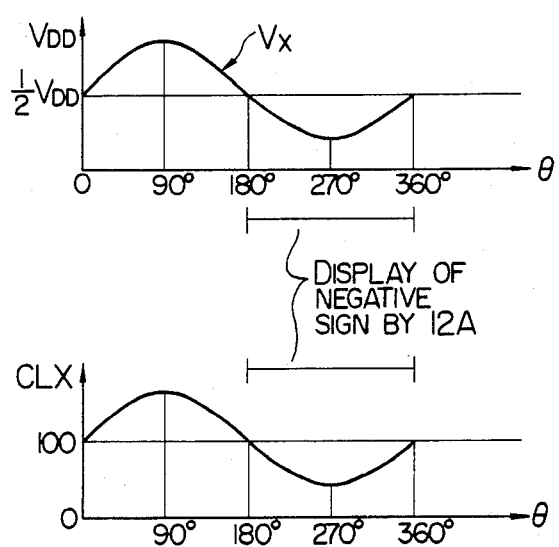

(b) If $\frac{1}{2}VDD < VX \leq VDD$ or 100 pulses < CLX, then (CLS−100) is generated in BCD code form, which is an output signal used for the display of positive sign. As shown in the diagram of FIG. 1 indicating the relationship of the field incident angle θ and the magnetic sensor 1, the sign of the component HX is taken positive with the angle $\theta$ ranging from zero to 180 degrees and negative with the angle $\theta$ ranging from 180 to 360 degrees. FIG. 5 shows the relationship of the angle $\theta$, VX and CLX.

Figure 6:
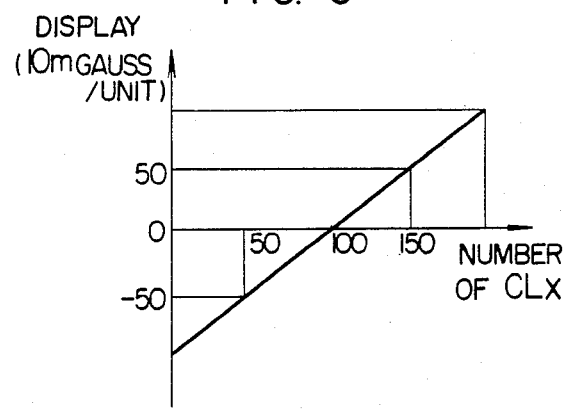

The signal $Q_3$ from the timing circuit 4 shown in (d) of FIG. 3 is a reset signal for resetting the counter content of the counter circuit 8A. A decoder/latch circuit 9A is responsive to the signal $Q_4$ from the timing circuit 4 shown in (e) of FIG. 3 to latch and convert the BCD output from the counter circuit 8A into 7-segment display drive signals and a display is made by 2-digit 7-segment LEDs 111 and 112 forming a digital display unit 11A. A sign detection or judging circuit 10 receives the output signal for the display of negative sign from the counter circuit 8A and generates a negative detection signal to make a display 12A give a negative display if the number of clock pulses CLX is less than 100. FIG. 6 shows the relationship between the number of clock pulses CLX and the display output. While the method of sensing and displaying in 2-digit digital form the component HX of the magnetic field in the X direction has been described, it should be apparent that the method of sensing and displaying the Y-direction component HY is all the same and it should also be apparent that the accuracy can be improved by increasing the number of output clock pulses per unit input voltage for A/D conversion and increasing the number of digits to be displayed.

Figure 7:
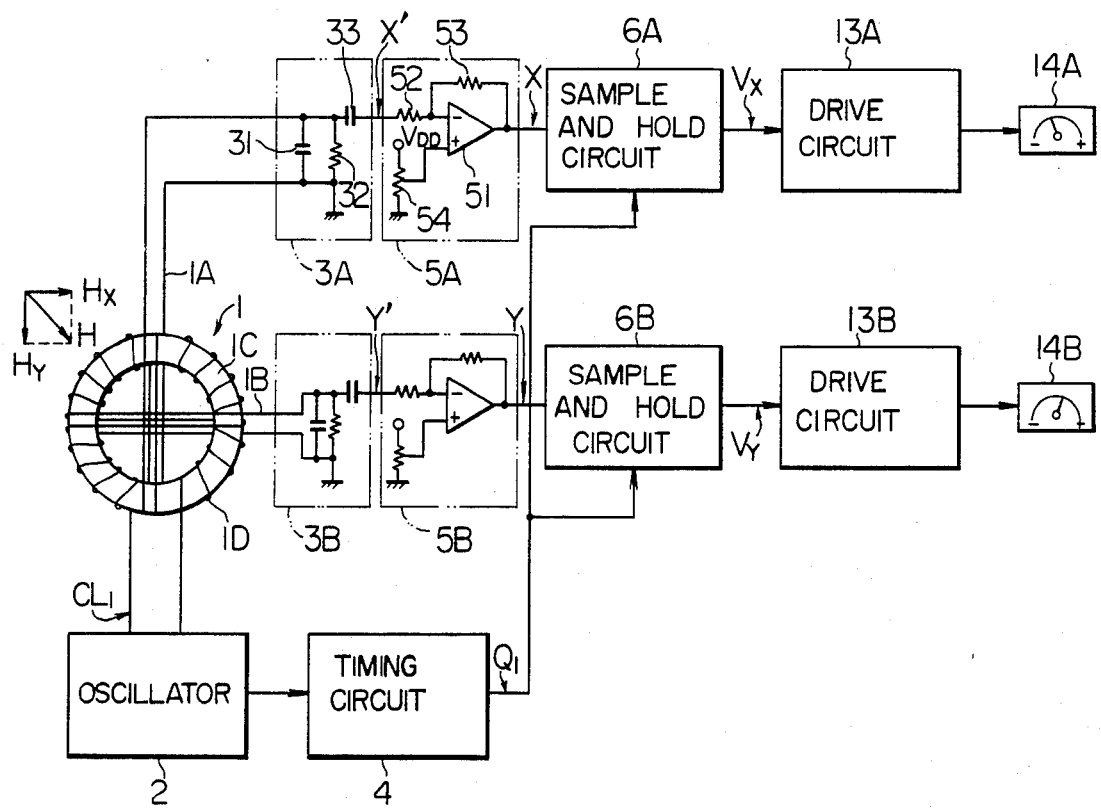
FIG. 7 is a block diagram showing the overall construction of a second embodiment of the invention.

FIG. 7 is a block diagram showing a second embodiment of the magnetic field measuring apparatus according to the invention and the second embodiment is designed to display the components of a magnetic field in the X and Y directions in analog form in contrast to the first embodiment in which the X- and Y-direction components HX and HY of a magnetic field are displayed in 2-digit digital form. The same component parts as used in the first embodiment are designated by the same reference numerals.

Numerals 13A and 13B designate drive circuits respectively responsive to the analog signals VX and VY which are proportional to the X- and Y-direction components HX and HY of a magnetic field so as to drive analog display meters 14A and 14B, respectively.

It will thus be seen from the foregoing that in accordance with the present invention, by virtue of the fact that the components of a magnetic field in the mutually perpendicular X and Y directions are simultaneously sensed by the same sensor and are displayed, there is a great advantage that the magnitudes of the orthogonal X- and Y-direction components of a magnetic field can be simultaneously and accurately read without the need to move the sensor.

We claim:

1. A magnetic field measuring apparatus comprising:
   a magnetic sensor for simultaneously generating a first and a second output signal respectively corresponding to components of a magnetic field in mutually perpendicular directions;
   an oscillator circuit for generating excitation pulses for exciting said magnetic sensor and analog-to-digital conversion control pulses;
   a timing circuit responsive to said oscillator circuit to generate first, second, third and fourth timing control signals;
   a first and a second signal processing channel each including a resonant circuit resonant with one of said sensor output signals to generate a resonance output, an adjusting circuit for amplifying said resonance output to generate an adjusted output, a sample and hold circuit responsive to said first timing control signal to sample and hold said adjusted output and generate a holding signal, an A/D converter circuit responsive to said holding signal, said analog-to-digital conversion control pulses and said second timing control signal to generate a number of clock pulses proportional to said holding signal, a counter responsive to said third timing control signal to count said clock pulses to generate a count value, and a decoder/latch circuit responsive to said fourth timing control signal to latch said count value, and
   a first and a second display respectively responsive to said decoder circuit to display digital outputs respectively corresponding to said mutually perpendicular field components.

2. A magnetic field measuring apparatus comprising:
   a magnetic sensor comprising a ring-type magnetic core having an excitation winding circumferentially wound therearound and a pair of output windings wound diametrically and orthogonally thereon for generating first and second output signals respectively corresponding to components of a magnetic field in mutually perpendicular directions;
   an oscillator circuit for generating a constant-frequency signal to be applied to said excitation winding of said magnetic sensor, said excitation winding of said magnetic sensor being connected to only said oscillator circuit;
   a timing circuit responsive to said constant-frequency signal from said oscillator circuit to generate a timing control signal;
   first and second resonance circuit means comprising respective capacitors and resistors for causing the generation of said first and second output signals in resonance with the respective inductances of said output windings of said magnetic sensor, said output windings of said magnetic sensor being connected to only the respective resonance circuit means;
   first and second sample-hold circuits responsive to said timing control signal to sample and hold said first and second outputs to generate first and second holding outputs;
   first and second drive circuits for generating first and second drive outputs in response to said first and second holding outputs; and
   a first and a second display responsive to the respective drive outputs to simultaneously display analog outputs respectively corresponding to said mutually perpendicular field components.

3. A magnetic field measuring apparatus according to claim 1, wherein said magnetic sensor comprises an excitation winding wound on a ring and a pair of output windings each wound on said core to surround opposing portions thereof such that said output windings cross each other at right angles.

4. A magnetic field measuring apparatus according to claim 3, wherein each of said resonant circuits comprises a filter circuit including one of said mutually perpendicular output windings, a resistor and a capacitor.

5. A magnetic field measuring apparatus according to claim 1, wherein each of said counters generates a negative sign indicative signal and a BCD code signal indicative of a value of $(N_R-N)$ when a count value N of said clock pulses is smaller than a predetermined value $N_R$ and generates a BCD code signal indicative of a value of $(N-N_R)$ when said count value N is greater than said predetermined value $N_R$, and further comprising sign detecting and displaying means responsive to said negative sign indicative signal from each said counter.

* * * * *